United States Patent
Cheung et al.

(10) Patent No.: US 10,158,324 B2
(45) Date of Patent: Dec. 18, 2018

(54) COMPUTATIONALLY EFFICIENT ARC DETECTOR WITH COHERENT SAMPLING

(71) Applicant: ANALOG DEVICES GLOBAL, Hamilton (BM)

(72) Inventors: Gordon Cheung, Sudbury, MA (US); John A. Hayden, Jamaica Plain, MA (US); Hans Brueggemann, Kelkheim (DE); Ahmed Ali Mohamed, Canton, MA (US)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 290 days.

(21) Appl. No.: 14/807,538

(22) Filed: Jul. 23, 2015

(65) Prior Publication Data
US 2017/0025996 A1   Jan. 26, 2017

(51) Int. Cl.
*H02S 50/10* (2014.01)
*G01R 19/25* (2006.01)
(Continued)

(52) U.S. Cl.
CPC .......... *H02S 50/10* (2014.12); *G01R 19/2509* (2013.01); *G01R 31/025* (2013.01);
(Continued)

(58) Field of Classification Search
CPC ... H02S 50/10; G01R 19/2509; G01R 31/025; G01R 31/40; H02H 1/0015; H02H 1/0092
(Continued)

(56) References Cited

U.S. PATENT DOCUMENTS

| | | | |
|---|---|---|---|
| 7,460,346 B2 | 12/2008 | Deshpande et al. | |
| 8,170,816 B2 | 5/2012 | Changali et al. | |

(Continued)

FOREIGN PATENT DOCUMENTS

| | | |
|---|---|---|
| CN | 102854426 A | 1/2013 |
| CN | 102914709 A | 2/2013 |
| WO | 2014/128263 | 8/2014 |

OTHER PUBLICATIONS https://web.archive.org/web/20150618052627/http://www.dspguide.com/ch15.htm, all pages.*

(Continued)

*Primary Examiner* — Fernando Hidalgo
(74) *Attorney, Agent, or Firm* — Patent Capital Group

(57) ABSTRACT

Switching interference is a primary artifact which affects the accuracy of arc detectors. To address switching interference, conventional arc detectors employ computationally intensive techniques which are often designed specifically for a target application. Thus, conventional arc detectors require a significant amount of hardware to accurately detect arc faults, which can increase costs of the power systems and prohibit wide deployment of arc detectors. With improved signal processing, a unique method for arc detection can accurately detect arc faults efficiently while tolerate switching interference from an inverter of the power system. Specifically, the method provides accurate but efficient arc detection by using a small Fast Fourier Transform with coherent sampling that is accomplished with a common clock generator in combination with signal conditioning. The overall system implementing the method is also programmable to suit a variety of target applications.

20 Claims, 12 Drawing Sheets

(51) Int. Cl.
*G01R 31/02* (2006.01)
*H02H 1/00* (2006.01)
*G01R 31/40* (2014.01)

(52) U.S. Cl.
CPC .......... *G01R 31/40* (2013.01); *H02H 1/0015* (2013.01); *H02H 1/0092* (2013.01)

(58) Field of Classification Search
USPC .......................................................... 702/58
See application file for complete search history.

(56) References Cited

U.S. PATENT DOCUMENTS

| | | | |
|---|---|---|---|
| 8,218,274 B2 | 7/2012 | Hastings et al. | |
| 2006/0203401 A1 | 9/2006 | Kojori et al. | |
| 2008/0296276 A1* | 12/2008 | Schartner | B23K 9/1031 219/130.31 |
| 2010/0097733 A1 | 4/2010 | Tomimbang | |
| 2010/0237693 A1* | 9/2010 | Funato | H02P 27/08 307/9.1 |
| 2012/0089266 A1 | 4/2012 | Tomimbang et al. | |
| 2012/0112760 A1* | 5/2012 | Yoscovich | H01L 31/02021 324/536 |
| 2012/0116696 A1* | 5/2012 | Wank | G01R 31/42 702/58 |
| 2012/0316804 A1 | 12/2012 | Oberhauser | |
| 2012/0318320 A1 | 12/2012 | Robbins | |
| 2013/0226479 A1 | 8/2013 | Grosjean | |
| 2015/0238147 A1* | 8/2015 | Figgatt | A61B 5/04023 600/513 |

OTHER PUBLICATIONS https://web.archive.org/web/20150503232830/https://ptolemy.eecs.berkeley.edu/eecs20/week12/freqResponseRA.html, all pages.*
EP Search Report issued in EP Patent Application Serial No. 16179102.5 dated Dec. 20, 2016, 10 pages.
Jay Johnson et al., "Crosstalk Nuisance Trip Testing of Photovoltaic DC Arc-Fault Detectors", Sandia National Laboratories, 978-1-4673-0066-7/12/$26.00 © 2011, 5 pages.
Scott McCalmont, "Low Cost Arc Fault Detection and Protection for PV Systems", NREL (National Renewable Energy Laboratory), Jan. 30, 2012-Sep. 30, 2013, 28 pages.
James A. Momoh et al., "Design and Analysis of Aerospace DC Arcing Faults using Fast Fourier Transformation and Artificial Neural Network", 0-7803-7989-6/03/$17.00 © IEEE, pp. 788-793 (6 pages).
Xiu Yao et al., "The Detection of DC Arc Fault: Experimental Study and Fault Recognition", 978-1-4577-1216-6/12/$26.00 © IEEE, pp. 1720-1727 (8 pages).
Arlo J. Aude, "A Tutorial in Coherent and Windowed Sampling with A/D Converters", AN9675, Feb. 1997, © Intersil Corporation 1999, 8 pages.
Zhan Wang et al., "Arc Fault and Flash Signal Analysis in DC Distribution Systems Using Wavelet Transformation", Apr. 25, 2015, 8 pages including IEEE Xplore Abstract.
Brett Novak, "Implementing Arc Detection in Solar Applications: Achieving Compliance with the new UL 1699B Standard", Jul. 10, 2012, EDN Network, 11 pages.
Jay Johnson et al., "Parametric Study of PV Arc-Fault Generation Methods and Analysis of Conducted DC Spectrum", Sandia National Laboratories, Photovoltaic Specialist Conference (PVSC), 2014 IEEE, Jun. 8-13, 2014, pp. 2543-3548, (8 pages) including IEEE Explore Abstract.
Tim Zgonena et al., "Photovoltaic DC Arc-Fault Circuit Protection and UL Subject 1699B", © 1995-2007 Underwriters Laboratories, Inc., Feb. 2011, 18 pages.
Paulo Fernando Ribeiro et al., "Power System Signal Processing for Smart Grids", John Wiley & Sons, Sep. 20, 2013, 2 pages.
English Translation of Foreign Reference (above)—CN102854426A, 7 pages.
English Translation of Foreign Reference (above)—CN102914709A, 4 pages.
English Translation of Foreign Reference (above)—WO2014/128263A1, 10 pages.

* cited by examiner

COMPUTATIONALLY EFFICIENT ARC DETECTOR WITH COHERENT SAMPLING

TECHNICAL FIELD OF THE DISCLOSURE

The present invention relates to the field of integrated circuits, in particular to arc detectors integrated with inverters.

BACKGROUND

Power systems are ubiquitous. Examples of power systems include industrial power plants, solar farms, wind farms, residential solar power systems, and electric automobiles. Typically, power systems supply, transmit and use electric power. Power is usually delivered over cables, and in some situations, cables can be disconnected, leaving a small air gap between conductors. Depending on the environment surrounding the air gap, an electric arc can form between the two conductors, which can be dangerous if the faulty part of the power system is not shut down in time. Especially when high voltage power is involved, the risk of electric shock or fire is high. For this reason, many power systems are equipped with arc detectors for detecting arc faults, which can be used to trigger arc fault circuit interrupters which can mechanically disconnect a faulty part of the power system like a circuit breaker. It is not surprising that the solar industry, for example, has developed a photovoltaic arc-fault circuit protection standard.

OVERVIEW

Switching interference is a primary artifact which affects the accuracy of arc detectors. To address switching interference, conventional arc detectors employ computationally intensive techniques which are often designed specifically for a target application. Thus, conventional arc detectors require a significant amount of hardware to accurately detect arc faults, which can increase costs of the power systems and prohibit wide deployment of arc detectors. With improved signal processing, a unique method for arc detection can accurately detect arc faults efficiently while tolerate switching interference from an inverter of the power system. Specifically, the method provides accurate but efficient arc detection by using a small Fast Fourier Transform with coherent sampling that is accomplished with a common clock generator in combination with signal conditioning. The overall system implementing the method is also programmable to suit a variety of target applications.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Safety Measures in Power Systems

Figure 1:
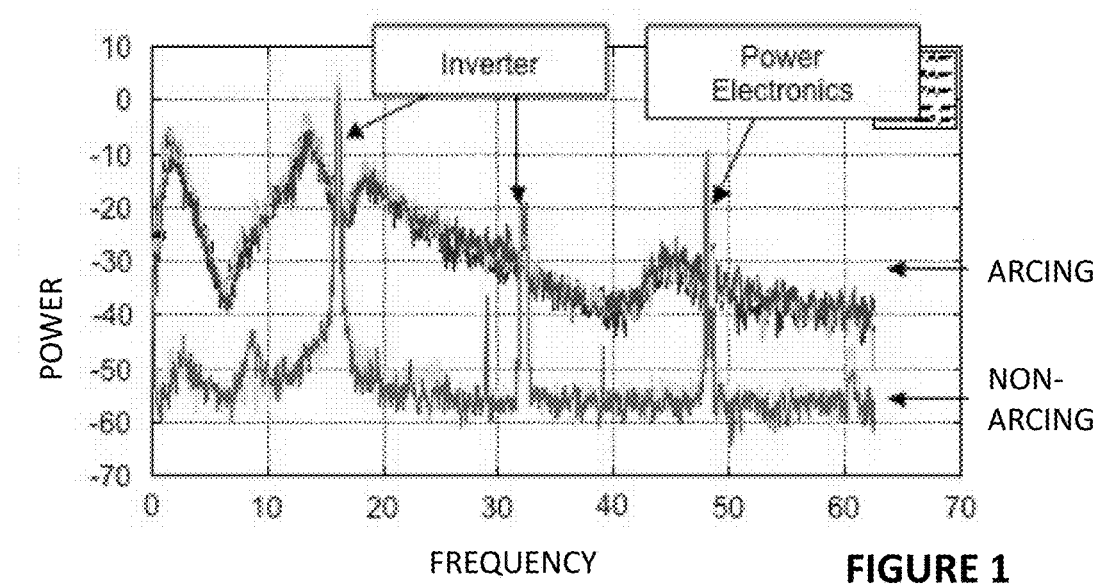
FIGS. 1 and 2 shows two illustrative spectrums, each spectrum showing the difference in response between an arcing system and a non-arcing system.

Arc faults in power lines can be dangerous, because the electric arc in the air gap between conductors can cause fires which can damage property or harm lives. When a cable disconnected or unbolted, ¼ inch or ½ inch spark can keep on burning until something falls on it and starts a fire. For instance, power systems, such as photovoltaic (PV) systems are at risk of arc faults if the connections between conductors are not secure and surrounding flammable materials can be set on fire. Typically, the PV systems are installed in open areas to receive sunlight, and thus, arc faults in conductors of these PV systems poses an even greater risk of fire because dry leaves or debris can fall on high voltage arcs. Some PV systems have many strings of modular PV modules for generating power, which increases the number of connectors which can potentially create an arc.

For at least these reasons, regulations have been prescribed for arc-fault protection to ensure safety. In PV systems, arc detector solutions have been provided to continuously monitor whether an arc fault is present. If an arc fault is detected, the solutions can trigger action(s) such as turning on an indicator light, sounding an alarm, shutting down an inverter, triggering a circuit interrupter, disconnecting a PV module from the string, and so forth.

There can be different types of faults in PV systems: series arc fault, parallel arc fault, ground fault, and internal fault. A series arc fault occurs when a (series) connector is disconnected or a conductor is broken. A parallel arc fault occurs when the grid is shorted because of a current path created by an electric arc across two parallel conductors. A ground arc fault occurs when a grounding path is broken. An internal fault occurs when a PV module has an internal failure, e.g., in the connector boxes of PV modules. Generally, fires are caused by series arc faults, and for that reason, the regulating bodies and industry have been focused on detecting series arc faults.

To provide a quality arc detector, an engineer may consider design requirements such as accuracy, speed, complexity, and cost. In terms of accuracy, an arc detector preferably can accurately detect arc faults (i.e., know when an arc fault is present) while have a small number of false positives (i.e., not trigger a shut down or an interrupt when an arc fault is not present). In terms of speed, an arc detector may need to detect the arc fault within seconds of the arc occurring in the PV system. In terms of complexity and cost, an arc detector preferably has few components so that the arc detector can cost less. Cheaper and less complex arc detectors can be more easily deployed widely. Furthermore, less complex detectors can have the potential to detect arc faults with less delay. Engineers faces a great challenge in designing an arc detectors in view of all these considerations; these considerations can sometimes compete against each other. For instance, engineers may trade off complexity for accuracy. Designing an efficient and accurate arc detector is not trivial.

Arc Detection by Spectral Analysis: Challenges

Arc-fault detection is an important and often required feature in PV solar panels systems. More importantly, reliable detection is important for preventing PV solar fire. To detect arc faults, arc detectors, an electronic component or circuitry (e.g., a microprocessor), analyze a signal on the power line to determine whether an arcing signature is present. If an arcing signature is present in the spectrum, an arc fault is believed to be present in the power system, and appropriate measure(s) are triggered. Typically, a computationally intensive processor is used to analyze the spectrum; based on the spectrum, the processor can classify whether an arcing signature is present.

Figure 2:
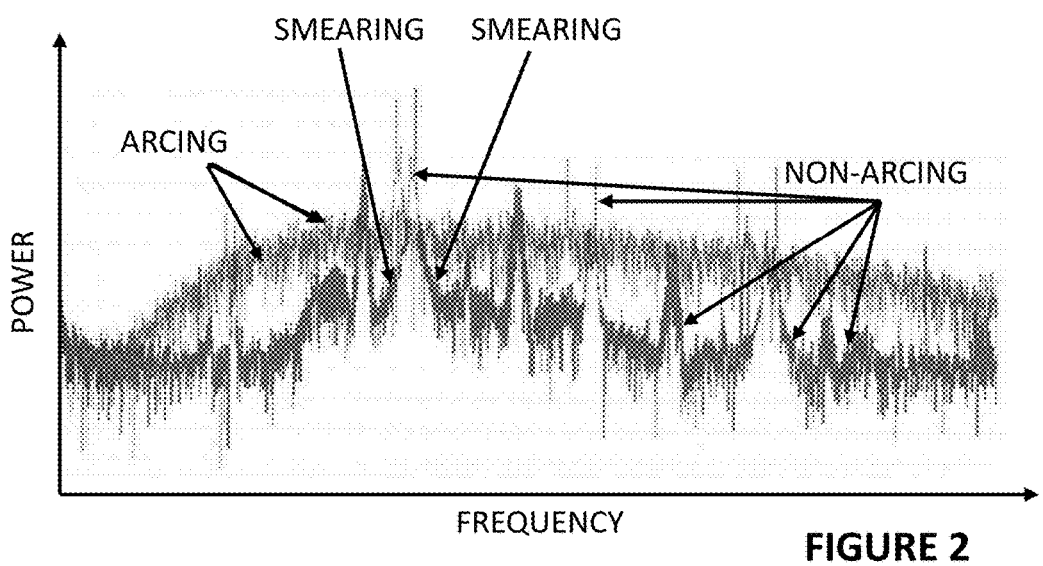

FIGS. 1 and 2 shows two illustrative spectrums, each spectrum showing the difference in response between an arcing system and a non-arcing system (arcing spectrum versus the non-arcing spectrum). The spectrum shows power of the signal over frequency (e.g. the signal in a frequency-domain, power spectrum, frequency spectrum). The noise floor in the absence of arcing, is roughly limited by the performance of the analog-to-digital converter sampling the signal. An arcing signature is characterized by a raised spectral noise floor. It can be seen with visual inspection of the two spectrums that the arcing spectrum is generally higher than the non-arcing spectrum for certain frequency bands (most frequencies). The raised spectral noise floor can be a characteristic that is usable as part of a spectral analysis to determine or classify whether arcing is present by comparing the power of the spectrum in a particular frequency band or frequency bin against a threshold (for many frequency bands or frequency bins).

It can be seen with visual inspection of the two spectrums that the non-arcing spectrum has peaks caused by switching interference (switching noise from the inverter) which have higher power than the arcing spectrum, thus making it harder for an arc detector to distinguish which noise floor is higher for some frequency bands or frequency bins. When arc-fault is present, the noise floor is raised by some detectable amount, but the noise floor can be noticeably lower than the switching noise peaks. The switching noise is made up of harmonics of the pulse width modulation (PWM) switching frequency tones of a PWM controller in an inverter of the power system. The switching noise can cause an arc detector to falsely detect arcing being present (i.e., lead to false positives).

When the sampling frequency of the analog-to-digital converter is not coherent to the PWM switching frequency, smearing can occur in the non-arcing spectrum, as seen in FIG. 2. It can be seen in FIG. 2, that the spectrum has switching noise peaks, and the noise floor rises at/near the peaks. The task of distinguishing the two noise floors is more difficult when smearing occurs, where the peak spreads like a tent in the frequency domain. When the PWM switching frequency is relatively low and smearing occurs, the peaks are spaced close together in the frequency domain, and the skirts of the peaks can significantly obscure the noise floor.

To improve the ability to distinguish the arcing spectrum and the non-arcing spectrum when smearing is present, arc detectors can take a Fast Fourier Transform (FFT) with a high resolution (e.g., a FFT having a size of thousands of samples or more). Such a solution would mean the system is computationally intensive, and would normally require a high performance processor core to deliver the timing performance required, and thus would greatly increase the cost of the arc detector.

Efficient Arc Detector with Coherent Sampling: An Exemplary Method

To monitor a power system for arc faults, such as strings of PV modules, circuitry can sample and monitor a signal on the power line to detect whether an arc fault is present. Usually, in less than a second or two, measures can be triggered to remedy or isolate an arc fault if arcing is detected. The challenge to providing an arc detector can be defined as how to provide real-time, highly accurate, arc detection at low cost and low latency while be able to tolerate the switching interference issues or other conditions that can lead to false positives.

Figure 3:
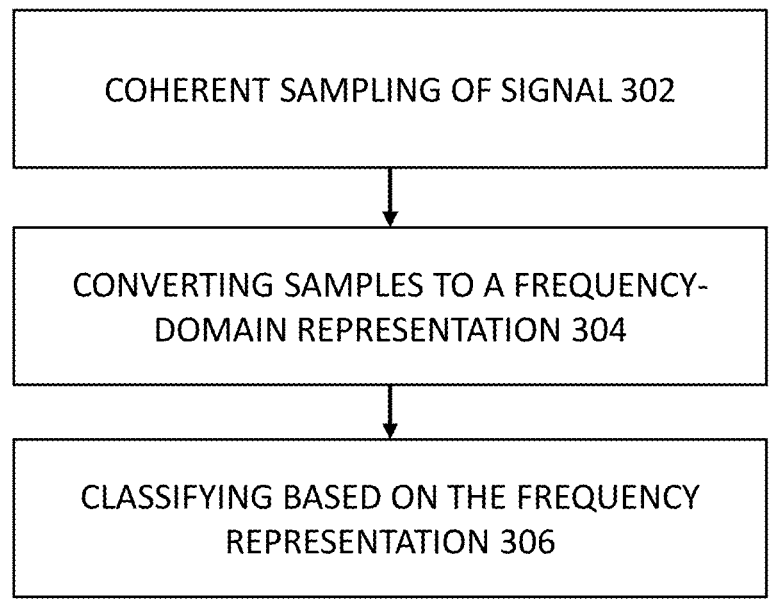
FIG. 3 shows a flow diagram illustrating a method for efficient arc detection that is tolerant to large magnitude switching interference of an inverter of a power system, according to some embodiments of the disclosure.

The present disclosure describes methods, apparatuses, and systems for efficient arc detection that is tolerant to (large magnitude) switching interference of an inverter of a power system. FIG. 3 shows a flow diagram illustrating a method for efficient arc detection that is tolerant to (large magnitude) switching interference of an inverter of a power system, according to some embodiments of the disclosure. An analog-to-digital converter samples a first signal on a first power line to generate a plurality of first digital samples at a sampling frequency coherent with a switching frequency of a pulse width modulation (PWM) controller of the inverter (box 302). The digital samples can include digital samples of voltage and/or current. A Fast Fourier Transform module transforms a first window of the first digital samples to a first frequency-domain representation (box 304). An arc detector classifies whether an arc fault is present in the power system based on the first frequency-domain representation (box 306).

The use of a Fast Fourier Transform (FFT) is deliberate (chosen for its efficiency and that it is easy to understand), and is not to be confused with other frequency transformations such as Discrete Fourier Transform (DFT) schemes and Wavelet schemes. A variety of FFT algorithms can be used, e.g., algorithms which can compute DFT in O(N log N) time or better. For instance, a Radix 2 FFT implementation with a maximum of 512 points can be used for the transformation. Preferably, the FFT is provided in as a dedicated/specialized hardware block to ensure fast processing.

Coherent Sampling

Coherent sampling (box 302) greatly reduces the size requirement of the Fast Fourier Transform (FFT), i.e., the number of samples used for generating one FFT frequency-domain representation without masking the actual noise floor. Coherent sampling, as used herein and applied to arc detectors described herein, refers to a mathematical relationship between the switching frequency of a PWM controller f_PWM of the inverter and the sampling frequency of the analog-to-digital converter f_ADC converting a signal of the power line to digital samples, a number of cycles of a switching waveform of the PWM controller M_PWM in the first window (e.g., the sampled set), and a number of samples of the FFT N_FFT:

$$\frac{f_{PWM}}{f_{ADC}} = \frac{M_{PWM}}{N_{FFT}}$$

The number of cycles of the switching waveform M_PWM is preferably as large as allowed or practicable), and the number of samples of the FFT N_FFT is preferably a power of two. In some embodiments, a ratio of the switching frequency and the sampling frequency is equal to a ratio of a number of cycles of a switching waveform of the pulse width modulation controller in the first window and a number of samples in the first window of digital samples. The ratio is preferably an integer, which an integer number of cycles of the switching frequency fit into the first window. In an example, for the purpose of arc detection and square wave as exhibited in a PWM waveform, it is possible to select $f_{PWM}/f_{ADC}$ to be $2^N$ and $N_{FFT}$ to be 512, $M_{pwm}$ or number of cycles of the PWM waveform would then be a power of 2.

By constraining N_FFT to a power of two, and carefully selecting a power of two ratio for $f_{PWM}/f_{ADC}$, an integer $M_{pwm}$ can be achieved. Integer $M_{pwm}$ represent the number of complete cycles of PWM waveform. Complete cycles of cyclical waveforms are free of discontinuity that can cause frequency domain smearing. When a coherent window of samples for a sine wave is selected, the resultant FFT is a clean single frequency tone in frequency domain. When a window size contain non-integer periods of a sine wave, the FFT result exhibit the smearing effect of incoherent sampling. The smearing effect would also be present if a square wave (e.g., a PWM waveform) is incoherently sampled.

Coherent sampling can control the spread or smearing of targeted noise bins in the FFT to allow for easier classification between arcing and non-arcing spectra without having to use an FFT with thousands of samples. By carefully selecting the sampling frequency of the ADC to be coherent with the switching frequency, the "spreading" of the switching noise tones to adjacent frequency bins can be controlled or kept small enough, even when using an FFT with fewer samples, and the noise floor would not be obscured by the skirts of the switching noise peaks. By using a lower resolution FFT, the arc detector would be far less computationally intensive, resulting in a lower cost, lower latency arc detector.

Generally speaking, a system designer works with an analog-to-digital convert having a range of supported sampling frequencies. Applying the size of the FFT (e.g., 512 samples or less) as a constraint, it is possible to select a sampling frequency that is coherent with a given switching frequency and ensure that there are a number of usable frequency bins between switching noise peaks for the arc detector to classify arcing versus non-arcing properly. Without coherent sampling, the smearing or skirts of switching noise bins can mask multiple neighboring frequency bins of information. Moreover, it is possible to adjust the sampling frequency of the ADC to accommodate a range of PWM switching frequencies. For instance, as PWM switching frequency increases, it is possible to adjust or configure the sampling frequency of the ADC (using one or more parameters) and maintain coherent sampling. The resulting arc detection system is thus flexible, and can be used for a wide variety of power systems. The following table illustrates possible sampling ratios that can be used within certain constraints (e.g., size of the FFT, maximum ADC sample rate, etc.) while have a number of bins BINS between PWM switching noise peaks, when the size of the FFT is 512 samples/points:

| f_PWM kHz | f_ADC kHz | BINS |
| --- | --- | --- |
| 4 | 512 | 3 |
| 8 | 512 | 7 |
| 10 | 640 | 7 |
| 12 | 768 | 7 |
| 14 | 896 | 7 |
| 16 | 512 | 15 |
| 18 | 576 | 15 |
| 20 | 640 | 15 |
| 22 | 704 | 15 |
| 30 | 960 | 15 |
| 32 | 512 | 31 |
| 40 | 640 | 31 |
| 42 | 672 | 31 |
| 50 | 800 | 31 |

Effectively, the effect of smearing is mitigated by keeping the sampling frequency coherent. When coherent sampling is used, the size of the FFT can be made smaller, or as small as possible (e.g., 512 samples, 256 samples, etc.). While the FFT with coherent sampling can still have some smearing, the skirts would be close together so there is more space (e.g., a higher fraction) of available bins to still determine where the noise floor is. Without coherent sampling, the skirts are wide and can make classification very difficult unless a high number of samples are used for the FFT (e.g., thousands of samples).

Signal Conditioning

Figure 4:
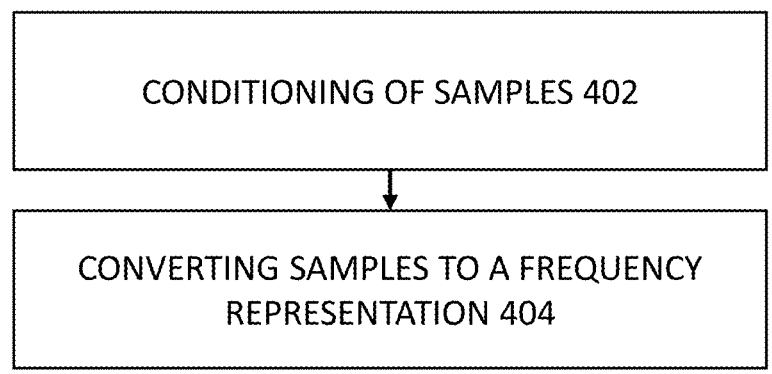
FIG. 4 shows a flow diagram illustrating a method for efficient arc detection with signal conditioning, according to some embodiments of the disclosure.

Besides coherent sampling, one or more signal conditioning schemes can be applied to the digital samples to enhance the ability to classify whether an arc fault is present in the power system. FIG. 4 shows a flow diagram illustrating a method for efficient arc detection with signal conditioning, according to some embodiments of the disclosure. An arc detector can condition samples (box 402) before the samples are converted to a frequency-domain representation (box 404). Signal conditioning of the samples can further reduce the effects of switching interference and/or smearing. Examples of signal conditioning includes applying a combing filter and applying a windowing function. A window of digital samples can be filtered by a comb filter prior to the FFT. The comb filter can attenuate spectral energy corresponding to the switching frequency. A window of digital samples can additionally or alternatively be processed by a windowing function prior to the FFT. Windowing function can further limit the smearing of incoherent noise in the captured window. The comb filter and windowing function are described in further detail later with FIG. 11.

Power System Having an Inverter with Integrated Arc Detector

Figure 5:
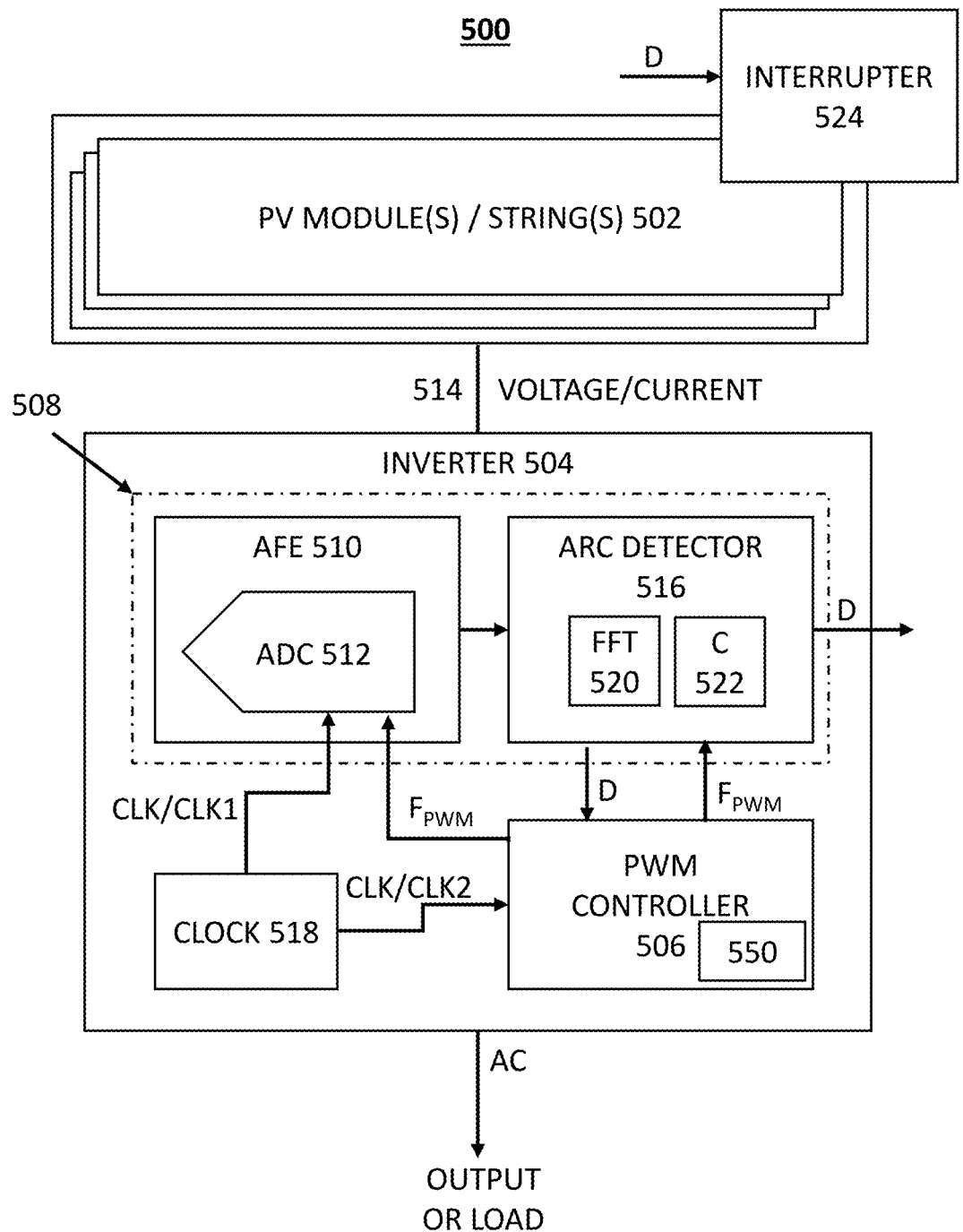
FIG. 5 shows an illustrative power system having efficient arc detection that is tolerant to large magnitude switching interference of an inverter of a power system, according to some embodiments of the disclosure.

FIG. 5 shows an illustrative power system having efficient arc detection that is tolerant to (large magnitude) switching interference of an inverter of a power system, according to some embodiments of the disclosure. The power system 500, in this example, a photovoltaic (PV) system, includes one or more PV modules (e.g., solar panels) or one or more strings of PV modules and an inverter 504. In PV systems with many PV modules, it is possible to have a plurality of inverters like inverter 504. Inverter 504 can include a PWM controller 506, which is semiconductor or electronic device that can transform DC power into controlled AC power using pulse-width modulation (PWM) switching. The PWM control 506 can include circuitry for controlling functions, and a part 550 for generating a pulse width modulation waveform having the switching frequency (e.g., including a control loop or scheduler which affects the PWM waveform). PWM switching is an efficient way to precisely regulate power level, but the transients of switching devices in the PWM controller 506 (e.g., part 550) can generate switching interference (harmonics in the spectrum) in the power system 500. As discussed above, the switching interference can affect arc detection and arc detector design.

Besides having a PWM controller 506, the inverter 504 is integrated with an arc detection system 508. The arc detection system 508 has an analog front end (AFE) 510 and an arc detector 516. The AFE 510 (analog or mixed signal processing) includes an analog-to-digital converter (ADC) 512 which can take a signal (voltage or current) of the power line 514 as input and provide digital samples as output. The ADC 512 can sample a first signal on a first power line 514 to generate a plurality of first digital samples at a sampling frequency coherent with a switching frequency of a pulse width modulation controller of the inverter. The arc detector 516 (digital signal processing) can include a FFT part 520 for transforming a first window of the first digital samples (as input) to a first frequency-domain representation (as output). Depending on whether signal conditioning is applied to the digital samples prior to the FFT, the input to the FFT part 520 may include the original first digital samples or a derivation of the first digital samples (processed/filtered version). The arc detector 516 further includes a classifier part 522 for classifying whether an arc fault is present in the power system based on the first frequency-domain representation.

When an arc fault is detected, the arc detector 516 can output a signal D which can trigger one or more action(s) such as turning on an indicator light, sounding an alarm, shutting down an inverter, signaling to the PWM controller 506, triggering a circuit interrupter 524, disconnecting a PV module from the string, etc.

Integration Benefits

Integrating the arc detection system 508 into the inverter 504 has a couple of technical advantages. The arc detection system 508 can perform better (improve signal conditioning and/or improve classification) if the switching frequency F_PWM is known. The PWM controller 506 can provide F_PWM or switching frequency information to arc detector 516. In some embodiments, the PWM switching frequency F_PWM would be available to the arc detector system 516, so that the ADC 512 can adjust its sampling frequency to ensure coherent sampling. Furthermore, integrating the arc detection system 508 to be in the same inverter as the PWM controller 506 means that the ADC 512 and the PWM controller 506 can be clocked by a same clock signal CLK, or clock signals CLK1 and CLK2 (respectively). The clock signals CLK1 and CLK2 can be generated based on the same root clock for coherent sampling. A common clock generator 518 (i.e., thus having a common clock crystal) generating a clock signal CLK, or in some embodiments, generating two clock signals CLK1, CLK2, can be used for both the ADC 512 and a part 550 of the PWM controller 506 for generating a PWM waveform (e.g., a control loop or scheduler which affects the PWM waveform) for (perfect) coherent sampling. Effectively, coherent sampling is made possible or easier because the overall arc detection system 508 having the ADC 512 is integrated with the PWM controller 506 in the inverter 504.

Arc Detector Processes

Figure 6:
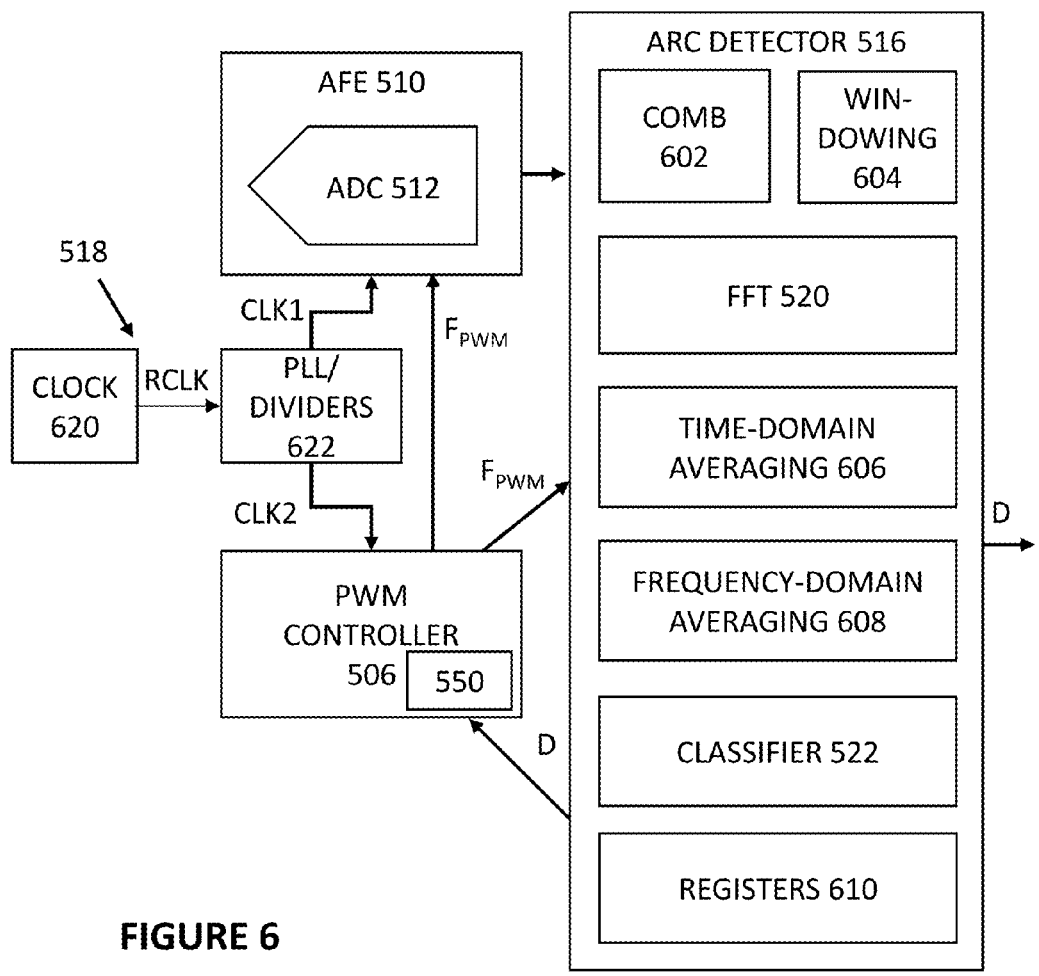
FIG. 6 shows details of the arc detector of the illustrative power system seen in FIG. 3, according to some embodiments of the disclosure.

FIG. 6 shows details of the arc detector of the illustrative power system seen in FIG. 3, according to some embodiments of the disclosure. One or more parts of the arc detector 516 can be implemented using dedicated/specialized hardware circuitry to provide fast hardware accelerated arc detection. The dedicated/specialized hardware can, in some embodiments, provide a first line of detection/defense without having to interrupt a main controller processor (to conserve compute cycles of the main controller processor).

The arc detector 516 receives digital samples (of the signal on the power line) from the AFE 510, and the FFT part 520 can use a moving window of samples to generate many FFT captures corresponding to different points in time (many frequency-domain representations over time). Based on the FFT captures, the classifier 522 can determine whether an arcing signature is present.

Depending on if and how signal conditioning is applied the arc detector can include one or more of the following: a (programmable) comb filter 602 for filtering the first window of first digital samples prior to the FFT, wherein the comb filter 602 attenuates spectral energy corresponding to the switching frequency, a windowing function 604 for processing the first window of first digital samples is processed prior to the FFT.

In some embodiments, the arc detector 516 includes averaging, e.g., time-domain averaging part 606 (illustrated by FIG. 8) and frequency-domain averaging part 608 (illustrated by FIG. 10) which processes output(s) of the FFT part 520, and provides an averaged version of the FFT capture(s) to classifier 522. Averaging can make the classifier 522 more robust in the presence of noise sources (e.g., noise by the ADC 512, noise in the signal of the power line, switching noise, etc.) and reduce false positives, thus making the overall arc detection system more accurate and tolerant to switching interference.

In some embodiments, the arc detector 516 is programmable or configurable using registers 610. One or more aspects of the arc detector processes can be programmed or configured to suit a particular power system and/or adapt to one or more external conditions. The registers 610 can store values for parameters of the arc detector processes. Parameters can turn select which one or more signal conditioning filters/functions to turn on or off. Parameters can tune the signal conditioning filters/functions (or select a type of filter/function to apply). For instance, the notches of a comb filter can be tuned using one of such parameters. In another instance, the shape of the windowing function can be selected using one of such parameters. Parameters can change the size of the FFT performed by FFT part 520. Parameters can change window sizes used by time-domain averaging part and frequency-domain averaging part. Parameters can also change which frequency bands or frequency bins are being examined by the classifier 522 to detect arcing. Parameters can change the threshold corresponding to the frequency bands or frequency bins. Parameters can include one or more parameters used by the classifier 522 (e.g., required number of votes in a voting scheme, masking or selection of selected frequency bands or frequency bins).

Various Implementations for the Common Clock Generator

As previously explained with respect to FIG. 5, the common clock generator 518 can generate a same clock signal CLK for clocking the ADC 512 and the part 550 of the PWM modulation controller. Broadly speaking, the clock signals clocking the ADC 512 and the part 550 of the PWM modulation controller can be different but generated using a common crystal, or using the same root clock signal.

To illustrate, FIG. 6 further shows an exemplary implementation for the (common) clock generator 518 of FIG. 5. In some embodiments, the common clock generator 518 can generate different clock signals CLK1 and CLK2 for clocking the ADC 512 and the part 550 of the PWM modulation controller respectively; the different clock signals CLK1 and CLK2 are generated from a same root clock signal RCLK for coherent sampling. Specifically, the single common clock generator 620 generates a root clock RCLK that can, e.g., drive a ratiometric block such as a phase locked loop (PLL) and/or clock dividers 622 to produce distinct clocks CLK1 for the ADC 512 and CLK2 for the PWM controller 506 (or the part 550 of the PWM controller). In some cases, the single common clock generator 620 and the PLL and/or clock divider 622 allows CLK1 and CLK2 to retain a precise integer:integer relationship to one another. For example, the ADC sample clock CLK1 might be generated via a PLL at a 24:340 frequency ratio to root clock RCLK, while the PWM clock CLK2 might be generated at a 24:10 frequency ratio to root clock RCLK.

Accordingly, the clock signals CLK1 and CLK2 can be derived directly from a same root clock signal, or by integer:integer ratios from the same root clock signal, for coherent sampling.

Bin-by-Bin Programmable Thresholds, Custom Algorithms

As described previously and seen in FIGS. 1 and 2, an arcing signature is associated with a raised noise floor for certain frequency bands or frequency bins. The classifier 522 of the arc detector 516 can detect whether an arcing signature is present by examining the spectrum and determining whether the noise floor is above a particular threshold. Specifically, classifying whether the arc fault is present in the power system based on the first frequency-domain representation can include determining, on a bin by bin basis, whether a power of the first frequency-domain representation is above a (programmable) threshold (or equivalently, above or equal to the (programmable) threshold. Different thresholds can be used for different frequency bands or frequency bins. In some embodiments, the thresholds can be programmed based on the particular application. The thresholds can be determined empirically, and/or adapted over time (e.g., through adaptation algorithms or learning algorithms). The classifier circuitry in the arc detector determines whether each value in a plurality of selected bins in the first frequency-domain representation are above a respective threshold. In one example, the classifier determines arcing is present (or likely to be present) if all of the selected bins are above the respective thresholds. In another example, the classifier determines arcing is present (or likely to be present) if a certain number or fraction of the selected bins are above the respective thresholds. Registers can be used for storing programmable thresholds corresponding to the plurality of selected bins. The bins can be selected based on the particular application, e.g., based on where arcing signature or raised noise floor is expected to be detectable, based on where switching noise peaks are not present or masking the noise floor, etc.

Besides using a bin-by-bin approach, some embodiments may include an embedded processor which can execute a program having a more sophisticated custom algorithm for arc detection (designed for a specific system). For example, the custom algorithm can be designed for a system having known background noise signature.

Digital System for Arc Detection

Figure 7:
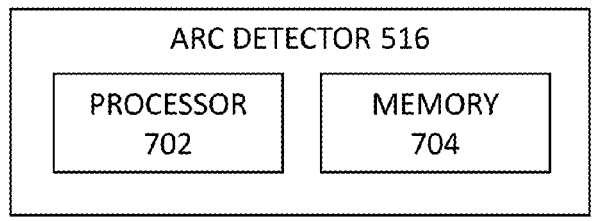
FIG. 7 shows exemplary hardware for providing an arc detector, according to some embodiments of the disclosure.

FIG. 7 shows exemplary hardware for providing an arc detector, according to some embodiments of the disclosure. One or more parts or processes of the arc detector (e.g., as illustrated by FIG. 5) can be implemented or executed by a processor 702, carrying out instructions stored on memory 704. Data such as the digital samples and the frequency-domain representations (FFT captures) can be stored on memory 704 as well.

Parts of various apparatuses for arc detection can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGS. 5 and 6 may be implemented on a board of an associated electronic device, e.g., an inverter. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGS. 5-6 may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the arc detection functionalities may be implemented in one or more silicon cores in Application Specific Integrated Circuits (ASICs), Field Programmable Gate Arrays (FPGAs), and other semiconductor chips.

Time-Domain Averaging for Dealing with Transient Noise Sources

Figure 8:
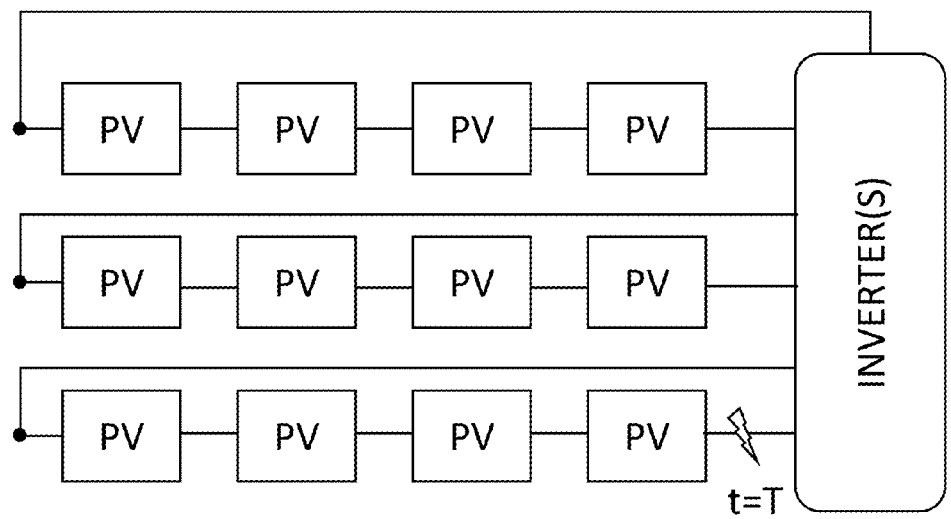
FIG. 8 shows an exemplary power system illustrating a transient noise source on a string of photovoltaic panel, according to some embodiments of the disclosure.

While coherent sampling and signal conditioning of the digital samples helps reduce smearing, other noise sources can potentially affect the accuracy of the arc detector, or cause false positives. FIG. 8 shows an exemplary power system illustrating a transient noise source (depicted as a bolt) on multiple strings of photovoltaic panels, according to some embodiments of the disclosure. The power system, in this example, has three PV strings and one or more inverters. When an actual arc fault occurs at t=T, the spectrum would most likely change state from having a non-arcing signature to an altered state having an arcing signature. One would expect the spectrum would stay in the altered state until the arc fault is removed. In contrast, when a transient noise source is present, the spectrum may change to an altered state for a very short duration and returns to the non-arcing state. It is important that an arc fault is not detected in the presence of such noise source. To address noise sources which affects the spectrum only for a short period of time (transients), the arc detector can include a time-domain averaging part (e.g., time-domain averaging part 606 of FIG. 6) for averaging values for a particular bin over a plurality of frequency-domain representations (a (programmable) window of FFT captures) to generate a time-domain average of a power spectrum of the power system, and a classifier (e.g., classifier 522 of FIGS. 5 and 6) can classify whether the arc fault is present based further on the time-domain average. The time-domain average can smooth out any transients which are not likely to be associated with arc faults, and thus prevent those transient noise sources from causing a false positive.

Dealing with Global Noise Sources

Figure 9:
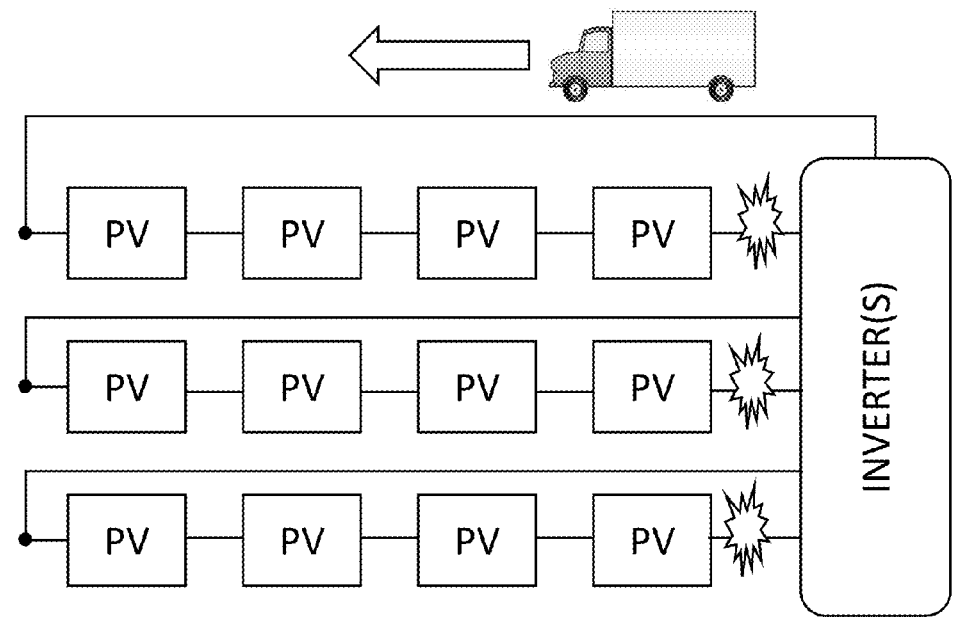
FIG. 9 shows an exemplary power system illustrating a global noise source on multiple strings of photovoltaic panels, according to some embodiments of the disclosure.

Besides transient noise sources, other global noise sources can affect arc detection. FIG. 9 shows an exemplary power system for illustrating a global noise source on a string of photovoltaic panels affecting arc detection, according to some embodiments of the disclosure. The power system, in this example, has three PV strings and one or more inverters. If a global noise source is present, e.g., a truck driving by the three PV strings and changing the respective spectra at the same time, an arc detector could potentially detect arcing when arcing is not actually present and shuts down all three PV strings unnecessarily. Assuming that arcing is more likely to occur on one PV string at a given time, and such global noise source would disturb all three spectra corresponding to the three PV strings at the same time (e.g., whose signals on the power lines are sampled and converted into FFT captures separately), the classifier (e.g., classifier 522 of FIGS. 5 and 6) can leverage multiple FFT captures associated with multiple PV strings at a given time to reject false positives caused by global noise sources. For instance, a classifier (e.g., classifier 522 of FIGS. 5 and 6) can classify whether the arc fault is present in the power system based on a plurality of frequency domain representations, including (1) a first frequency-domain representation generated based on a first window of first digital samples of a first signal of a first power line and (2) a second frequency-domain representation generated based on a second window of second digital samples of a second signal of a second power line in the same power system as the first power line. If both the first and second frequency-domain representations trigger arc detection, the classifier can override or disregard such concurrent triggers, since concurrent triggers is not very likely to be associated with an actual arc fault (more likely to occur on one power line only). In some embodiments, the overriding of concurrent triggers is more restricted. For instance, the classifier may only over ride concurrent triggers if the triggers originated from the same frequency bin, assuming global noise sources would appear on multiple spectra at a fixed frequency band or frequency bin.

Frequency-Domain Averaging for Increasing Robustness

Besides the dominant switching noise peaks, it can be seen in the spectra in FIGS. 1 and 2 that the spectra often has other noise artifacts which could potentially cause false positives (the noise floor is not a continuous clean line, but has many small peaks). Without further processing of the FFT spectrum, such noise artifacts can affect arc detection when the classifier compares the power for a frequency bin or band against a simple threshold. To address the other noise artifacts present in the noise floor, a frequency-domain averaging part (e.g., frequency-domain averaging part 608 of FIG. 6) can performing a moving average of the first frequency-domain representation before classifying whether the arc fault is present in the power system. Effectively, the spectrum is smoothed out to increase the robustness of the classifier. The moving average can use a window whose size can be programmable based on the particular application to control how much averaging is needed for satisfactory robustness. Exemplary window sizes include 4 frequency bins, 8 frequency bins, 16 frequency bins, etc.

Figure 10:
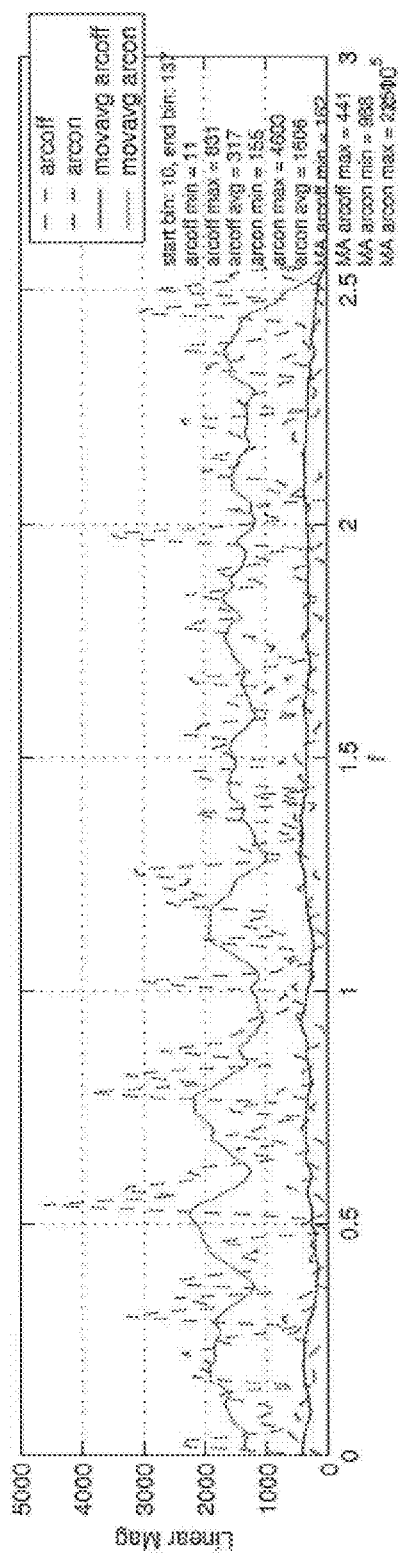
FIG. 10 shows exemplary frequency-domain representations used for arc detection, according to some embodiments of the disclosure.

FIG. 10 shows exemplary frequency-domain representations used for arc detection, according to some embodiments of the disclosure. The dotted lines show arcing and non-arcing spectra without frequency-domain averaging; the solid lines show arcing and non-arcing spectra after frequency-domain averaging. It can be seen that when the spectrum is averaged using a moving window of multiple frequency bins (in the frequency-domain), a classifier can easily separate and distinguish between an arcing spectrum and a non-arcing spectrum using a simple threshold, making the classifier more robust against fluctuations in the spectrum.

Figure 11:
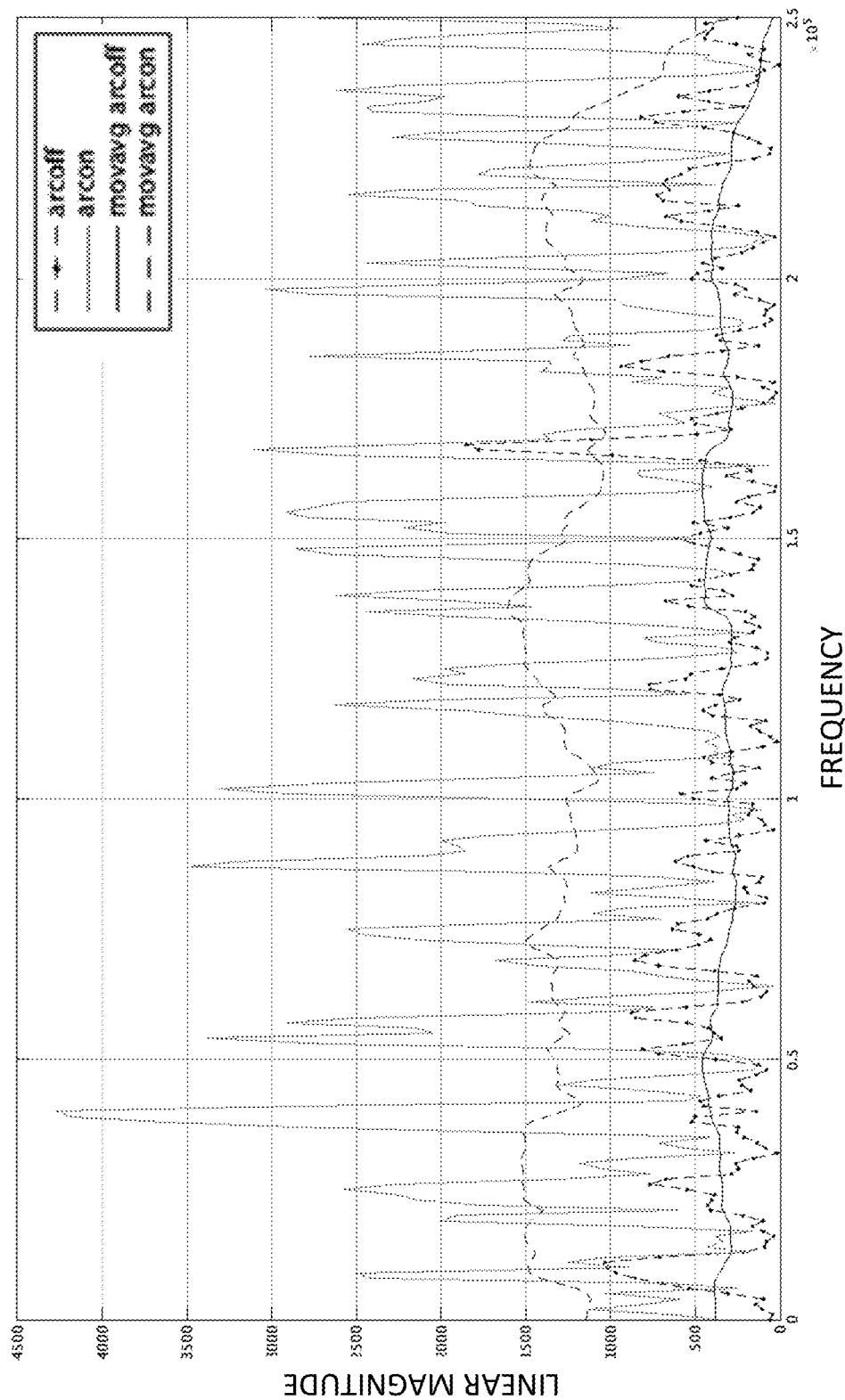
FIG. 11 shows exemplary frequency-domain representations used for arc detection, according to some embodiments of the disclosure.

FIG. 11 shows exemplary frequency-domain representations used for arc detection, according to some embodiments of the disclosure. It can be observed in this plot as well that frequency-domain averaging can be applied to help separate and distinguish between an arcing spectrum (see, without moving average "arc on", averaged "movavg arc on") and a non-arcing spectrum (see, without moving average "arc off", averaged "movavg arc off") using a simple threshold.

Comb Filter and Windowing Function for Signal Conditioning

One possible technique in combating incoherent sampling is the application of windowing function. Exemplary windowing function include Hammin, Hanning, and Blackman windows, which have different time domain shapes and but similar frequency responses. Generally speaking, these functions have similar bell curve shape in the frequency domain where the two ends taper to 0. They differ in terms of the frequency domain shape in terms of width and rejection slope of the side lobes around the original signal. When multiplied with a collection of input samples, any given function diminishes to 0 at the edge. As a result, any windowed function can be concatenated smoothly because the start and end points are the same and equal to 0. Comparing these functions, one can observe that coherent windowing is the most ideal function (coherent windowing refers to a boxcar filter having 1's for the window length and 0's otherwise, and the window length corresponds to an integer multiple periods of the periodic signal of interest). All other windowing functions have some loss of magnitude at the bin of interest (see the peak value), and some spreading. However, windowing function is still advantageous when coherent sampling is not possible. Accordingly, signal conditioning can include a windowing function that can be programmed with any windowing function to combat secondary substantial noise that are incoherent to the selected window.

Figure 12:
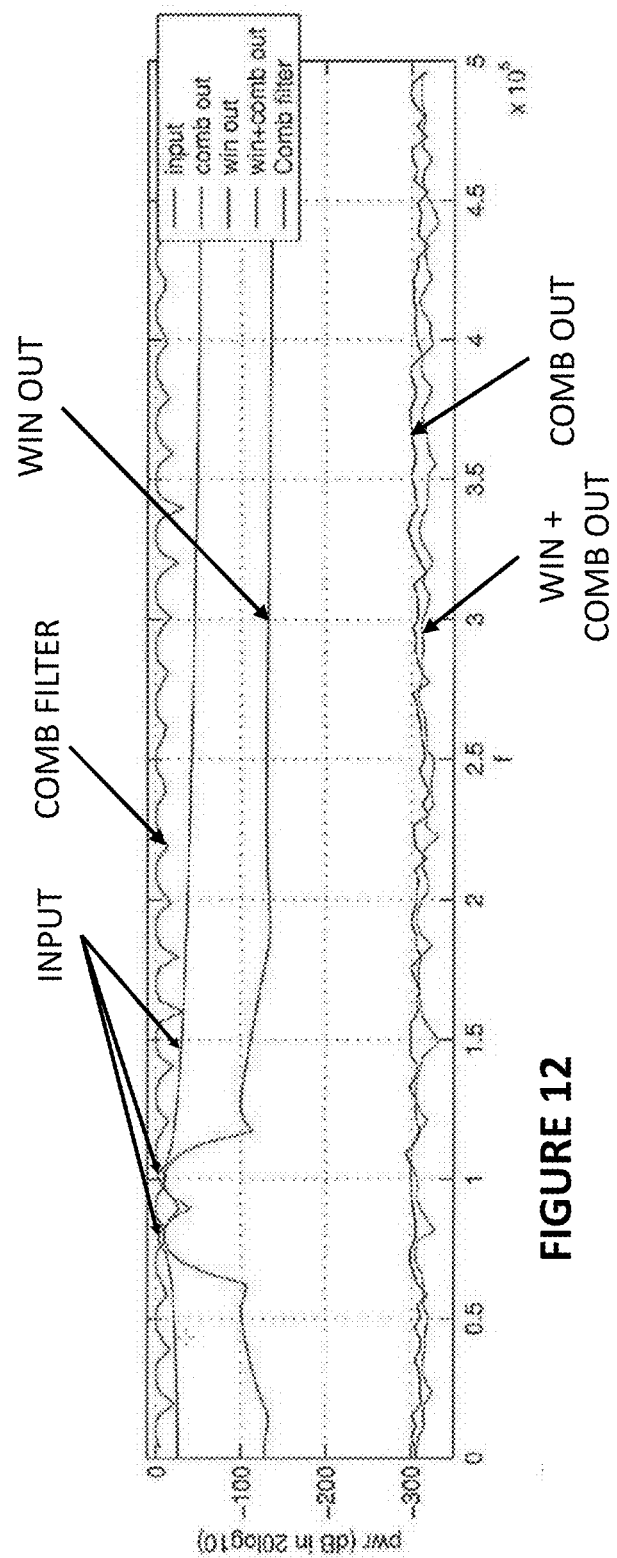
FIG. 12 illustrates the effects of a comb filter and a windowing function for arc detection in frequency domain, according to some embodiments of the disclosure.

FIG. 12 illustrates the effects of a comb filter and a windowing function for arc detection in frequency domain, according to some embodiments of the disclosure. The "input", for illustration, has PWM switching noise tones in frequency-domain. The spreading or smearing of the peaks can be especially severe when there is no coherent sampling, making it very difficult for the classifier to detect the noise floor.

To remove the switching interference, the arc detector can include a comb filter having notches which attenuates right at the peaks (as seen in the "comb filter" response). A comb filter can be implemented if the switching frequency f_PWM is known. It can be seen from the "comb out" spectrum that the two peaks are removed and the spectrum drops down to −300 db. By using a programmable comb filter, the comb filter can be tuned to the switching frequency to eliminate the switching noise peaks right at f_PWM, leaving only the noise floor behind. In some embodiments, the comb filter can be applied in the time-domain before the FFT part, by adding a weighted/scaled and delayed sample to a current sample, wherein the delay length is programmable (e.g., y[n]=x[n]+a*x[n−K], wherein "a" is the scaling factor or weight and K is the programmable delay length). By setting the proper delay length, the switching noise peaks can be substantially removed from the spectrum (gets combed out). In some embodiments, a frequency-bin mask is applied instead of using a comb filter to disregard information in frequency bins associated with the switching noise peaks.

To reduce smearing, the arc detector can provide a windowing function before the FFT part. Windowing function reduces the effects of discontinuities in the time-domain signal caused by incoherent sampling, and can mitigate smearing in the frequency-domain. A variety of windowing functions are suitable, including Hamming window, Hanning window, Blackman window, etc. A suitable windowing functions tapers at the ends of a particular window size in the time-domain, and the signal (i.e., the digital samples) is multiplied by the windowing function. In the frequency-domain, the frequency-domain representation of signal (i.e., the digital samples) is convolved with a frequency-domain representation of the windowing function. As seen in the "win out" spectrum, applying the windowing function squeezes the two peaks and reduces smearing/spreading.

When a comb filter and a windowing function are used together, the resulting spectrum can be substantially free of the switching noise peaks, as seen in the "win+comb out" spectrum, leaving only the noise floor behind at −300 db.

Figure 13:
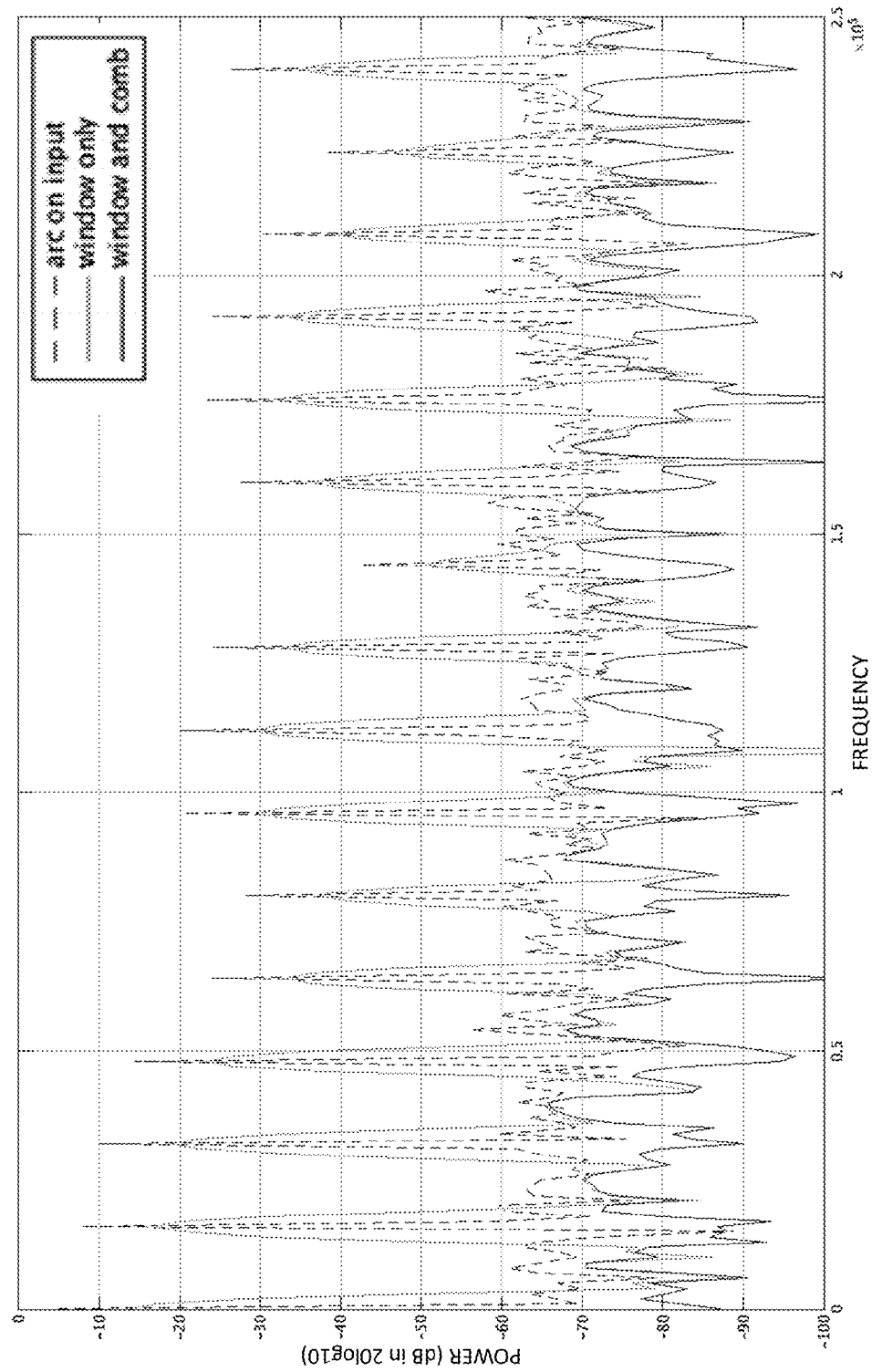
FIG. 13 illustrates the effects of a comb filter and a windowing function when coherent sampling is used and the switching frequency is at 16 kHz, according to some embodiments of the disclosure.

FIG. 13 illustrate the effects of a comb filter and a windowing function when coherent sampling is used and the switching frequency is at 16 kHz, according to some embodiments of the disclosure. "arc on input" is the signal of the power line which is sampled with coherent sampling described herein. "window only" shows the effect of a windowing filter on the "arc on input" signal. Effect of applying the windowing filter is minimal since coherent sampling is used. "window and comb" shows the effect of the windowing filter and a comb filter. With the additional comb filter, the peaks seen in "arc on input" are substantially removed.

Figure 14:
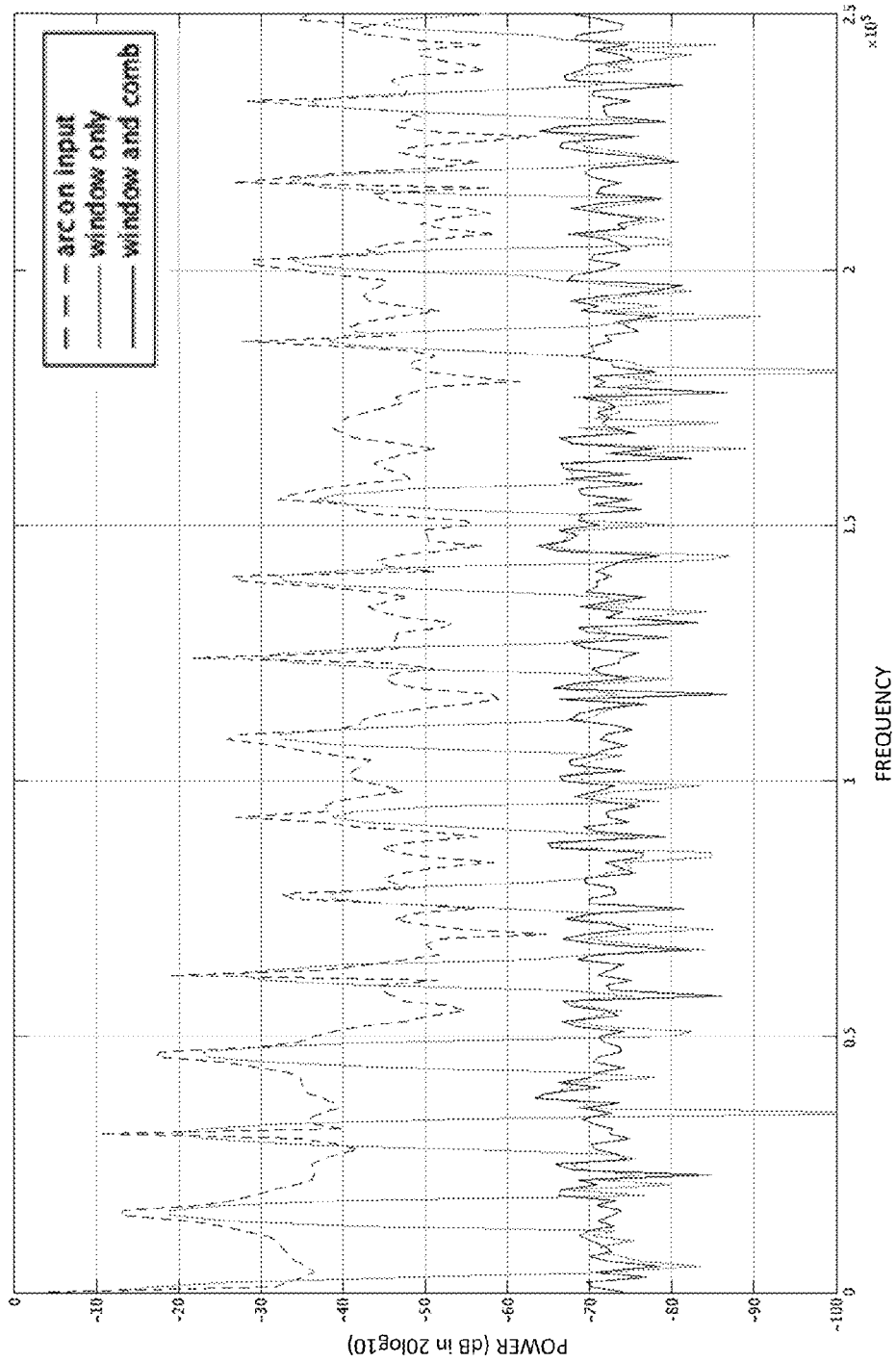
FIG. 14 illustrates the effects of a comb filter and a windowing function when coherent sampling is not used and the switching frequency is at 15.5 kHz, according to some embodiments of the disclosure.

FIG. 14 illustrate the effects of a comb filter and a windowing function when coherent sampling is not used and the switching frequency is at 15.5 kHz, according to some embodiments of the disclosure. "arc on input" is the signal of the power line which is sampled without coherent sampling described herein. It can be observed from the plot that smearing is significant, and the effect of smearing has obscured the noise floor of the signal. "window only" shows the effect of a windowing filter on the "arc on input" signal. Smearing is somewhat controlled with the windowing filter, which is beneficial since the signal is not coherently sampled. "window and comb" shows the effect of the windowing filter and a comb filter. With the additional comb filter, the peaks present in "arc on input" are substantially removed, and it is visually clearer where the noise floor when comparing "window and comb" to "arc on input". Accordingly, in some embodiments, the comb filter can be applied to address the issue of incoherent sampling, e.g., if coherent sampling is not possible.

Note that in this example, the "arc on input" has significant smearing due to incoherent sampling. The comb filter, when configured appropriately, can combat the effect of smearing due to incoherent sampling effectively because the comb filter is tuned to 16 kHz, which is close to the 15.5 kHz switching frequency. While the valley of the filter does not align precisely with the switching frequency, the misalignment generally gets worse at higher multiples of the square wave tones. In this example, 16 kHz and 15.5 kHz are reasonably close, thus the comb filter yields acceptable results in addressing smearing.

Note that the comb filter would yield unacceptable results, when the signal bin is half way between integer oversampling rate. Consider one example where the sampling rate is 512 kHz and the comb filter is tuned to 16 kHz. The oversampling ratio is 512/16=32. An example of a bad case for the combing filter could be a square wave PWM frequency at 512/32.5=15.754 kHz. If the ADC clock is not scalable to be coherent and sampling rate stays at 512 kHz, then neither a comb filter of n*512/32=n*16 kHz, nor n*512/33=15.515 kHz can effectively remove tones at n*15.754 kHz.

Figure 15:
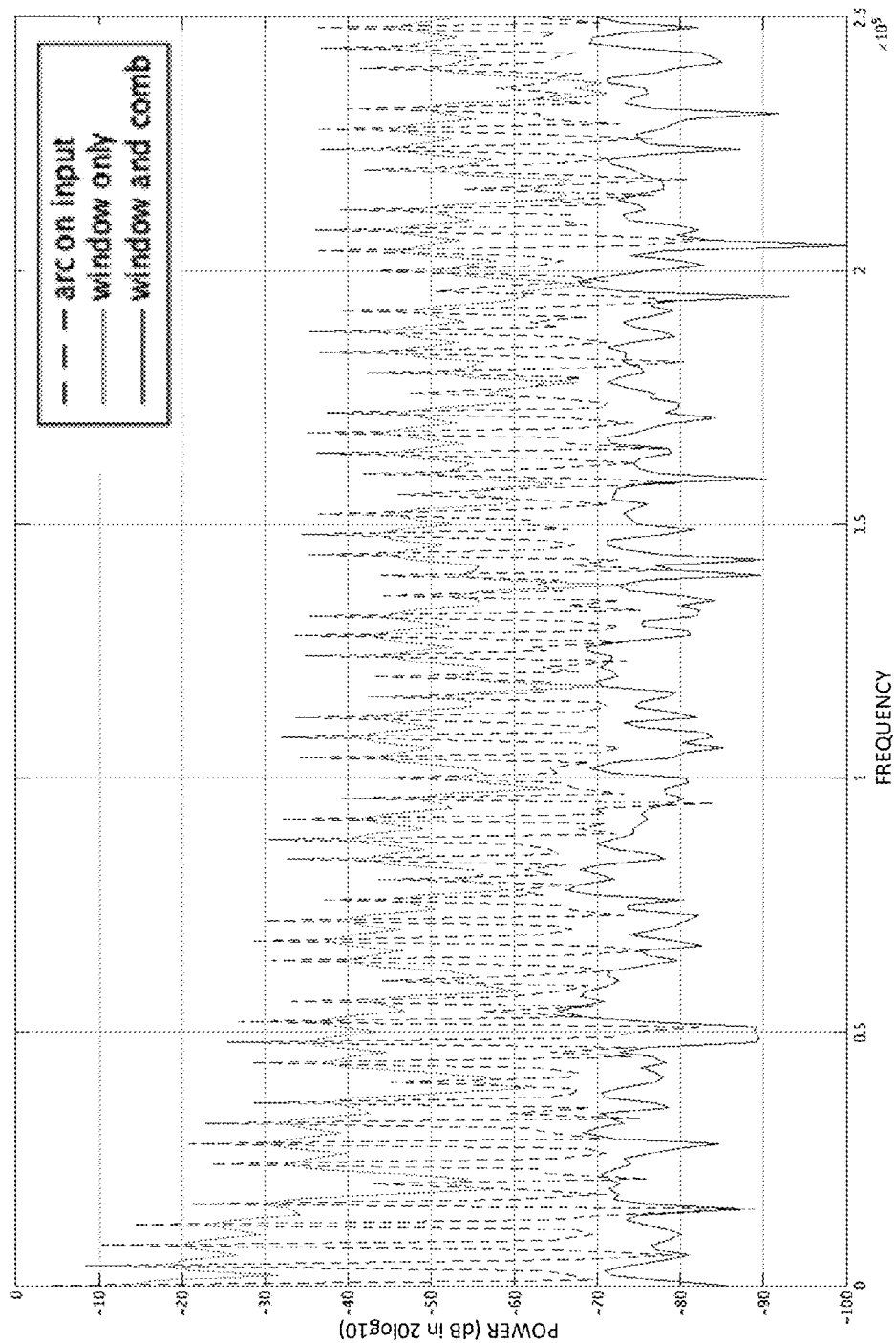
FIG. 15 illustrates the effects of a comb filter and a windowing function when coherent sampling is used and the switching frequency is at 4 kHz, according to some embodiments of the disclosure.

FIG. 15 illustrate the effects of a comb filter and a windowing function when coherent sampling is used and the switching frequency is at 4 kHz (where peaks are much closer than the peaks when switching frequency is at 16 kHz as seen in FIG. 13), according to some embodiments of the disclosure. "arc on input" is the signal of the power line which is sampled with coherent sampling described herein. "window only" shows the effect of a windowing filter on the "arc on input" signal. Effect of applying the windowing filter is minimal since coherent sampling is used. "window and comb" shows the effect of the windowing filter and a comb filter. With the additional comb filter, the peaks seen in "arc on input" are substantially removed.

Figure 16:
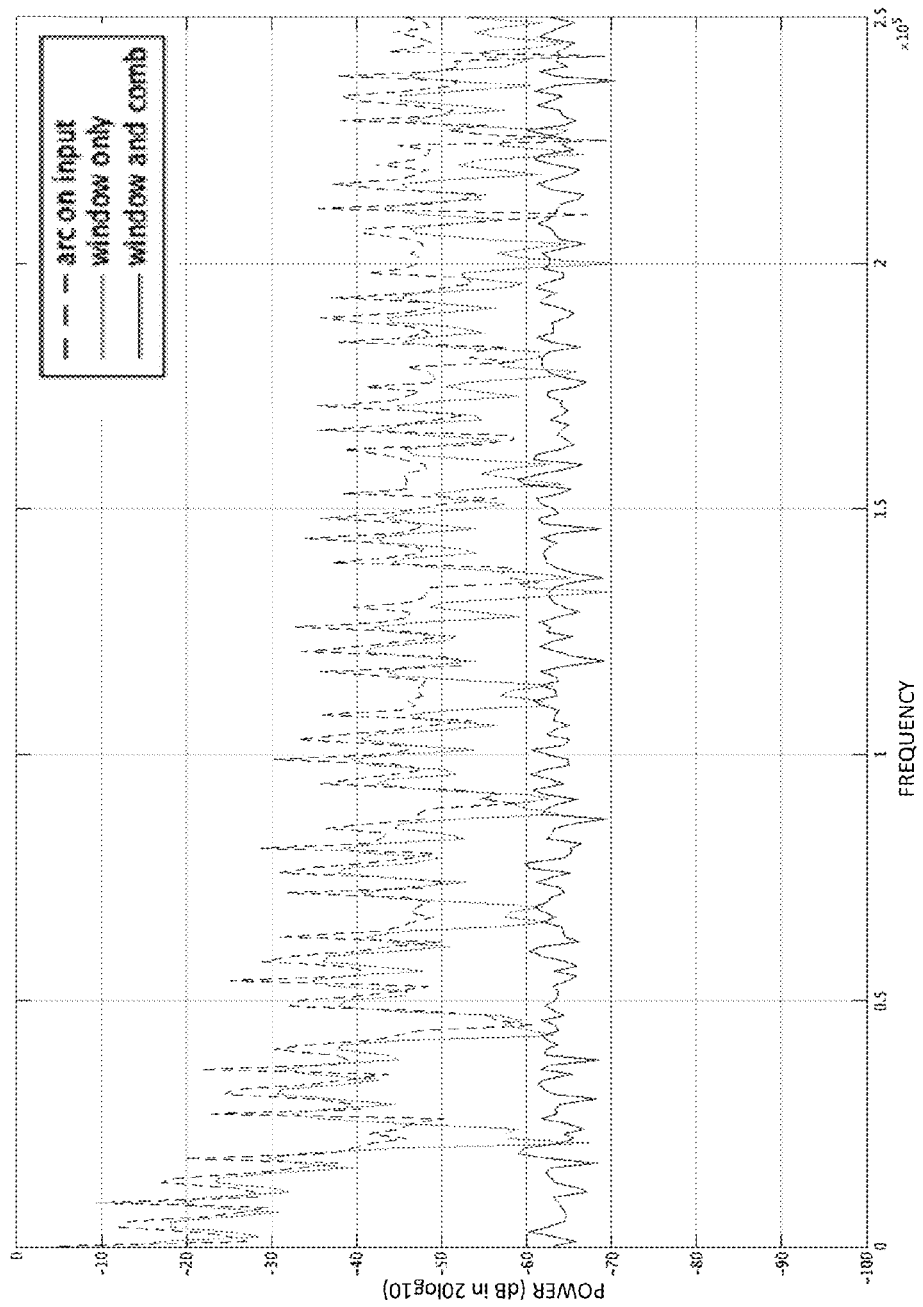
FIG. 16 illustrates the effects of a comb filter and a windowing function when coherent sampling is not used and the switching frequency is at 4.5 kHz, according to some embodiments of the disclosure.

FIG. 16 illustrate the effects of a comb filter and a windowing function when coherent sampling is not used and the switching frequency is at 4.5 kHz (where peaks are much closer than the peaks when switching frequency is at 15.5 kHz as seen in FIG. 1), according to some embodiments of the disclosure. "arc on input" is the signal of the power line which is sampled without coherent sampling described herein. "window only" shows the effect of a windowing filter on the "arc on input" signal. Smearing is controlled with the windowing filter, which is beneficial since the signal is not coherently sampled. "window and comb" shows the effect of the windowing filter and a comb filter. With the additional comb filter, the peaks present in "arc on input" are substantially removed.

VARIATIONS AND IMPLEMENTATIONS

While the present disclosure describes an exemplary arc detector being used for PV systems, it is envisioned by the disclosure that the arc detector described herein would be advantageous for other power systems such as motor inverters or systems where arcing can occur and arc detection is desirable.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, and elements of the FIGS. 5-7 may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGS. 5-7 and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to arc detection, illustrate only some of the possible arc detection functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

What is claimed is:

1. A method for arc detection with improved distinction between an arcing and a non-arcing spectrum, the method comprising:
   receiving, by an arc detector, switching frequency information of a pulse width modulation controller of an inverter of a power system;
   sampling, by an analog-to-digital converter, a first signal on a first power line to generate a plurality of first digital samples at a sampling frequency determined based on said switching frequency information for coherent sampling;
   transforming, using a digital signal processor, a first window of the first digital samples to a first frequency-domain representation; and
   classifying, by the arc detector, whether an arc fault is present in the power system based on the first frequency-domain representation.

2. The method of claim 1, wherein:
   the analog-to-digital converter and a part of the pulse width modulation controller for generating a pulse width modulation waveform having the switching frequency information are clocked by a same clock signal for coherent sampling.

3. The method of claim 1, wherein:
   the analog-to-digital converter and a part of the pulse width modulation controller for generating a pulse width modulation waveform having the switching frequency information are clocked by clock signals generated from a same root clock signal for coherent sampling.

4. The method of claim 1, wherein:
   a ratio of the switching frequency information and the sampling frequency is equal to a ratio of a number of cycles of a switching waveform of the pulse width modulation controller in the first window and a number of samples in the first window of the first digital samples for coherent sampling.

5. The method of claim 4, wherein:
   the number of cycles of the switching waveform is a power of two; and/or the number of samples is a power of two.

6. The method of claim 1, wherein the first window of the first digital samples is filtered by a comb filter prior to transforming using the digital signal processor, wherein the comb filter attenuates spectral energy corresponding to the switching frequency information.

7. The method of claim 1, wherein the first window of the first digital samples is processed by a windowing function prior to transforming using the digital signal processor.

8. The method of claim 1, further comprising:
performing a moving average of the first frequency-domain representation before classifying whether the arc fault is present in the power system.

9. The method of claim 8, wherein a window used for the moving average is programmable.

10. The method of claim 1, further comprising:
averaging values for a particular bin over a plurality of frequency-domain representations to generate a time-domain average of a power spectrum of the power system; and
classifying, by the arc detector, whether the arc fault is present based further on the time-domain average.

11. The method of claim 1, further comprising:
classifying, by the arc detector, whether the arc fault is present in the power system based further on a second frequency-domain representation generated based on a second window of second digital samples of a second signal of a second power line in the same power system as the first power line.

12. The method of claim 1, wherein classifying, by the arc detector, whether the arc fault is present in the power system based on the first frequency-domain representation comprises: determining, on a bin by bin basis, whether a power of the first frequency-domain representation is above a programmable threshold.

13. An apparatus with arc detection with improved distinction between an arcing and a non-arcing spectrum, the apparatus comprising:
an arc detector for receiving switching frequency information of a pulse width modulation controller of an inverter of a power system;
an analog-to-digital converter for sampling a first signal on a first power line to generate a plurality of first digital samples at a sampling frequency coherent with a switching frequency of a pulse width modulation controller of an inverter of a power system;
a common clock generator generating clock signals for coherent sampling for both the analog-to-digital converter and a part of the pulse width modulation controller for generating a pulse width modulation waveform having the switching frequency;
a digital signal processor for transforming a first window of the first digital samples to a first frequency-domain representation; and
a classifier part for classifying whether an arc fault is present in the power system based on the first frequency-domain representation.

14. The apparatus of claim 13, wherein:
the sampling frequency is configurable based on the switching frequency for coherent sampling.

15. The apparatus of claim 13, further comprising:
a programmable comb filter for filtering the first window of first digital samples prior to transforming using the digital signal processor, wherein the programmable comb filter attenuates spectral energy corresponding to the switching frequency.

16. The apparatus of claim 13, further comprising:
a windowing function for processing the first window of first digital samples is processed prior to transforming using the digital signal processor.

17. The apparatus of claim 13, wherein the classifier part determines whether each value in a plurality of selected bins in the first frequency-domain representation are above a respective threshold.

18. The apparatus of claim 17, further comprising:
registers for storing programmable thresholds corresponding to the plurality of selected bins.

19. An apparatus for arc detection with improved distinction between an arcing and a non-arcing spectrum, the apparatus comprising:
means for receiving switching frequency information of a pulse width modulation controller of an inverter of a power system;
means for converting a first signal on a first power line to generate a plurality of first digital samples at a sampling frequency coherent with a switching frequency of a pulse width modulation controller of an inverter of a power system;
means for generating clock signals using a common crystal for coherent sampling for both the analog-to-digital converter and a part of the pulse width modulation controller for generating a pulse width modulation waveform having the switching frequency;
means for applying a frequency-domain representation transform to a first window of the first digital samples to a first frequency-domain representation; and
means for detecting whether an arc fault is present in the power system based on the first frequency-domain representation.

20. The method of claim 1, wherein the digital signal processor used for transforming a first window of the first digital samples to a first frequency-domain representation is a Fast Fourier Transform module.

* * * * *